United States Patent
Lavoie et al.

(10) Patent No.: US 8,222,746 B2
(45) Date of Patent: Jul. 17, 2012

(54) NOBLE METAL BARRIER LAYERS

(75) Inventors: Adrien R. Lavoie, Beaverton, OR (US);
Juan E. Dominguez, Hillsboro, OR (US); Aaron A. Budrevich, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 144 days.

(21) Appl. No.: 11/540,386

(22) Filed: Sep. 28, 2006

(65) Prior Publication Data

US 2007/0205510 A1    Sep. 6, 2007

Related U.S. Application Data

(63) Continuation-in-part of application No. 11/367,160, filed on Mar. 3, 2006.

(51) Int. Cl.
*H01L 23/48* (2006.01)
(52) U.S. Cl. .......................... 257/774; 438/686
(58) Field of Classification Search .................. 438/686; 257/774
See application file for complete search history.

(56) References Cited

U.S. PATENT DOCUMENTS

| | | | |
|---|---|---|---|
| 5,047,367 A | 9/1991 | Wei et al. | |
| 5,899,742 A * | 5/1999 | Sun ............................... | 438/682 |
| 6,204,172 B1 * | 3/2001 | Marsh ........................... | 438/653 |
| 6,645,847 B2 * | 11/2003 | Paranjpe et al. ............. | 438/622 |
| 6,779,951 B1 * | 8/2004 | Vale et al. .................... | 407/119 |
| 7,087,517 B2 | 8/2006 | Andreyushchenko et al. | |
| 7,220,671 B2 * | 5/2007 | Simka et al. ................. | 438/680 |
| 7,279,423 B2 | 10/2007 | Johnston et al. | |
| 7,354,849 B2 | 4/2008 | Plombon | |
| 7,391,112 B2 | 6/2008 | Li et al. | |
| 7,435,679 B2 | 10/2008 | Johnston et al. | |
| 7,459,392 B2 | 12/2008 | Johnston et al. | |
| 7,476,974 B2 | 1/2009 | Andreyushchenko et al. | |
| 7,625,817 B2 | 12/2009 | Gstrein | |
| 2003/0108674 A1 | 6/2003 | Chung et al. | |
| 2004/0053496 A1* | 3/2004 | Choi ............................. | 438/680 |
| 2004/0105934 A1* | 6/2004 | Chang et al. ............. | 427/255.28 |
| 2005/0061679 A1* | 3/2005 | Hardikar ....................... | 205/291 |
| 2006/0118954 A1* | 6/2006 | Eun .............................. | 257/751 |
| 2006/0220248 A1* | 10/2006 | Suzuki ......................... | 257/751 |
| 2006/0220249 A1* | 10/2006 | Johnston et al. ............. | 257/751 |
| 2006/0251872 A1* | 11/2006 | Wang et al. .................. | 428/209 |
| 2007/0014919 A1* | 1/2007 | Hamalainen et al. ....... | 427/248.1 |
| 2007/0099420 A1 | 5/2007 | Dominguez et al. | |
| 2007/0207611 A1 | 9/2007 | Lavoie et al. | |

(Continued)

OTHER PUBLICATIONS

D. Josell, "Iridium Barriers for Direct Copper Electrodeposition in Damascene Processing", Electrochemical and Solid-State Letters 9, Dec. 16, 2005, pp. C48-C50.

(Continued)

*Primary Examiner* — David Vu
*Assistant Examiner* — Brandon Fox
(74) *Attorney, Agent, or Firm* — Blakely, Sokoloff, Taylor & Zafman LLP

(57) ABSTRACT

Noble metal barrier layers are disclosed. In one aspect, an apparatus may include a substrate, a dielectric layer over the substrate, and an interconnect structure within the dielectric layer. The interconnect structure may have a bulk metal and a barrier layer. The barrier layer may be disposed between the bulk metal and the dielectric layer. The barrier layer may include one or more metals selected from iridium, platinum, palladium, rhodium, osmium, gold, silver, rhenium, ruthenium, tungsten, and nickel.

25 Claims, 14 Drawing Sheets

U.S. PATENT DOCUMENTS

2007/0264816 A1 11/2007 Lavoie et al.
2007/0269981 A1 11/2007 Lavoie
2007/0281476 A1 12/2007 Lavoie et al.
2008/0045013 A1 2/2008 Lavoie et al.
2008/0064205 A1 3/2008 Dominguez et al.
2008/0096381 A1 4/2008 Han et al.
2008/0194105 A1 8/2008 Dominguez et al.

OTHER PUBLICATIONS

T. Aaltonen, "Atomic Layer Deposition of Iridium Thin Films", Journal of the Electrochemical Society 151, Jun. 17, 2004, pp. G489-G492.

* cited by examiner

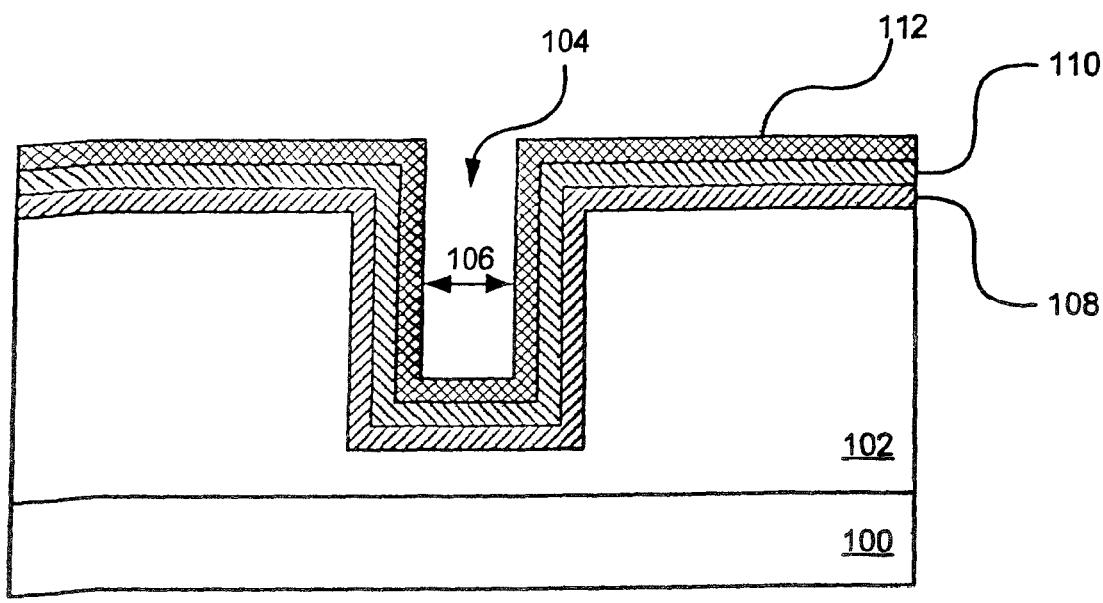
FIG._1A
(PRIOR ART)
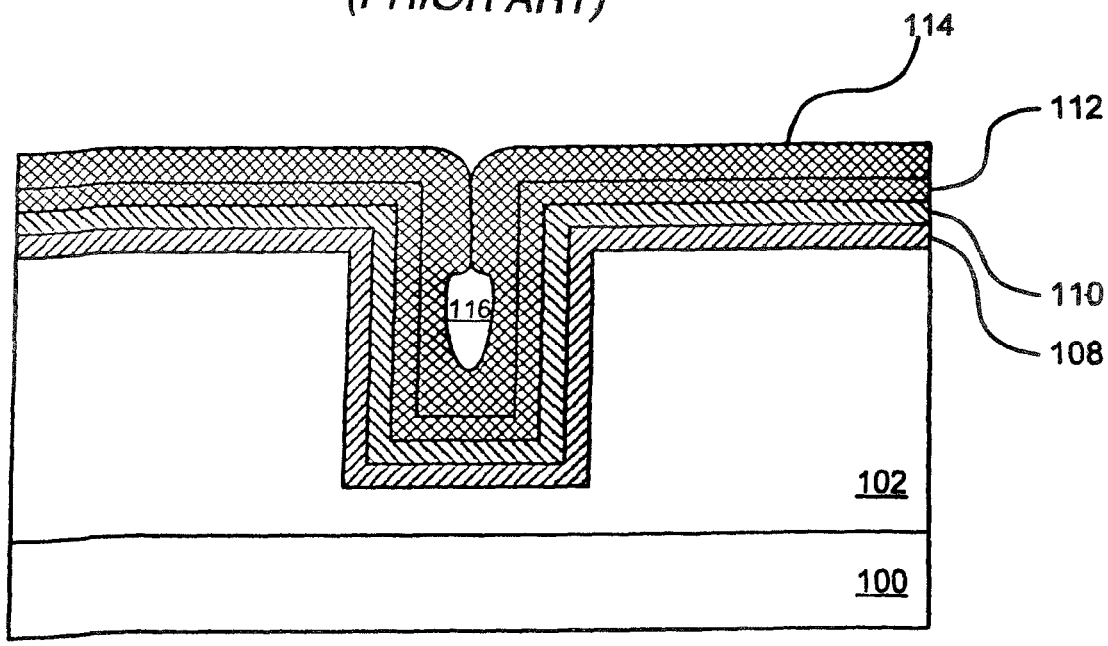
FIG._1B
(PRIOR ART)

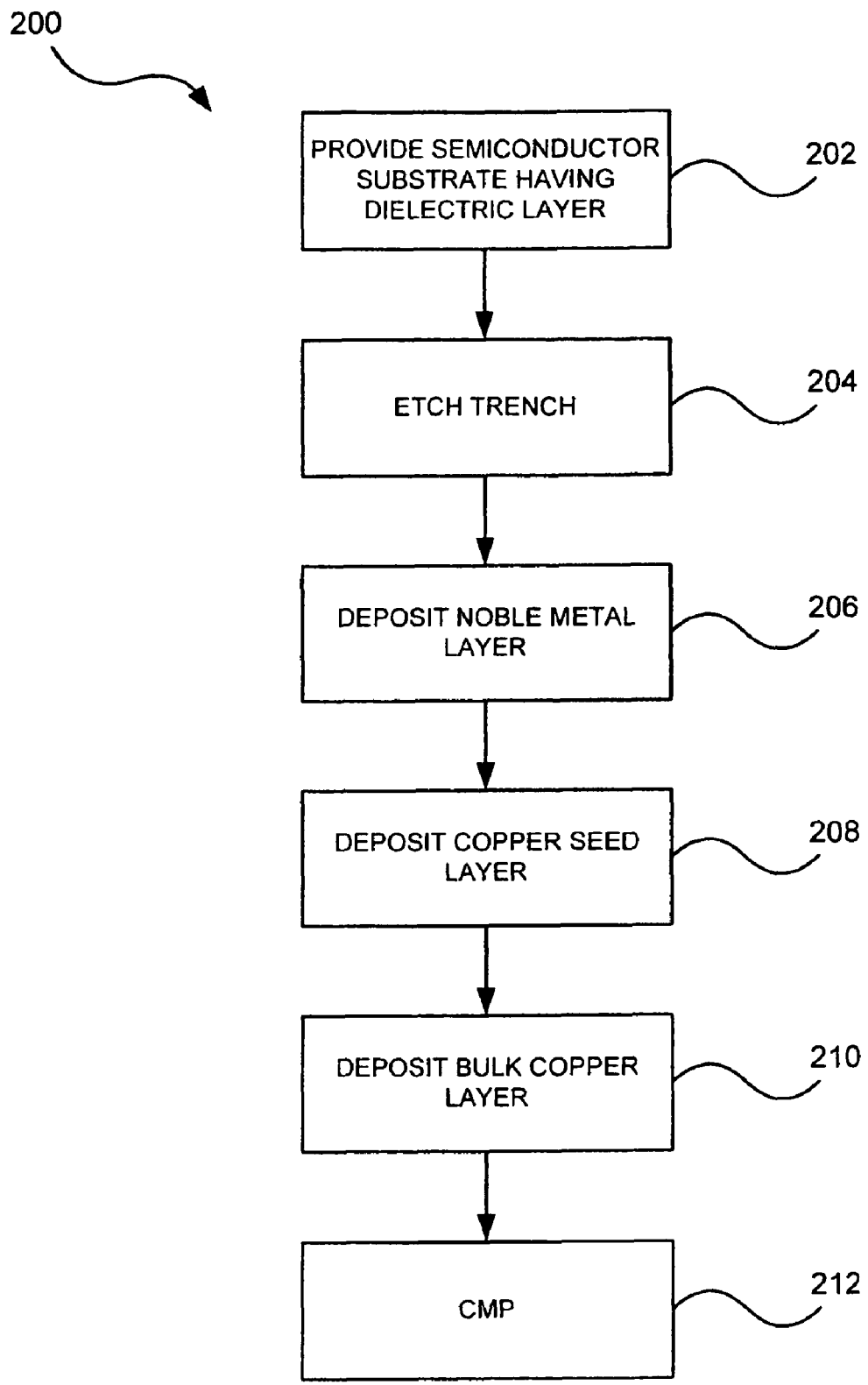
FIG._2

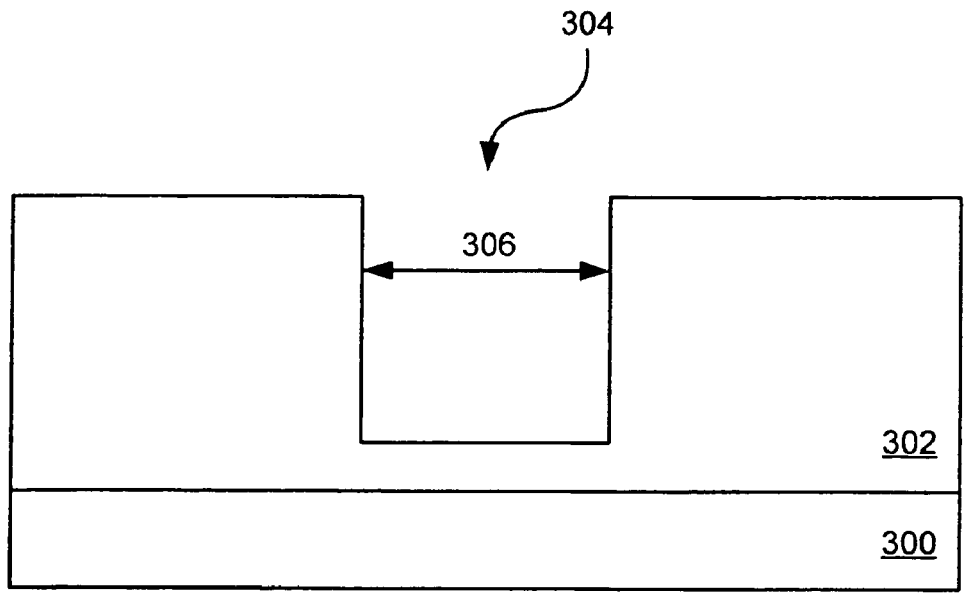
FIG._3A
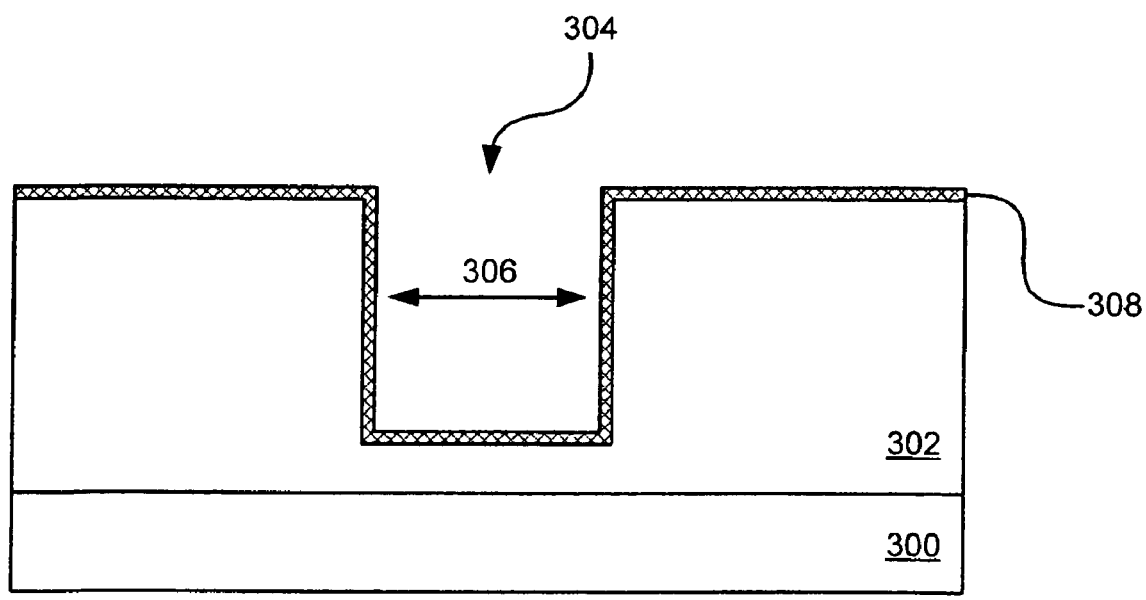
FIG._3B

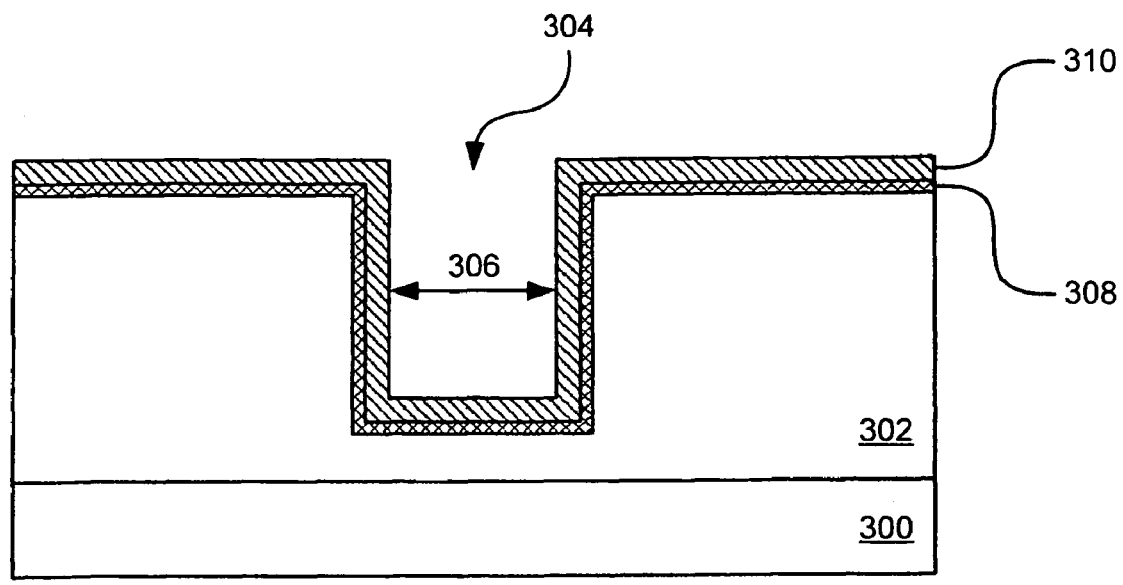
FIG. _3C
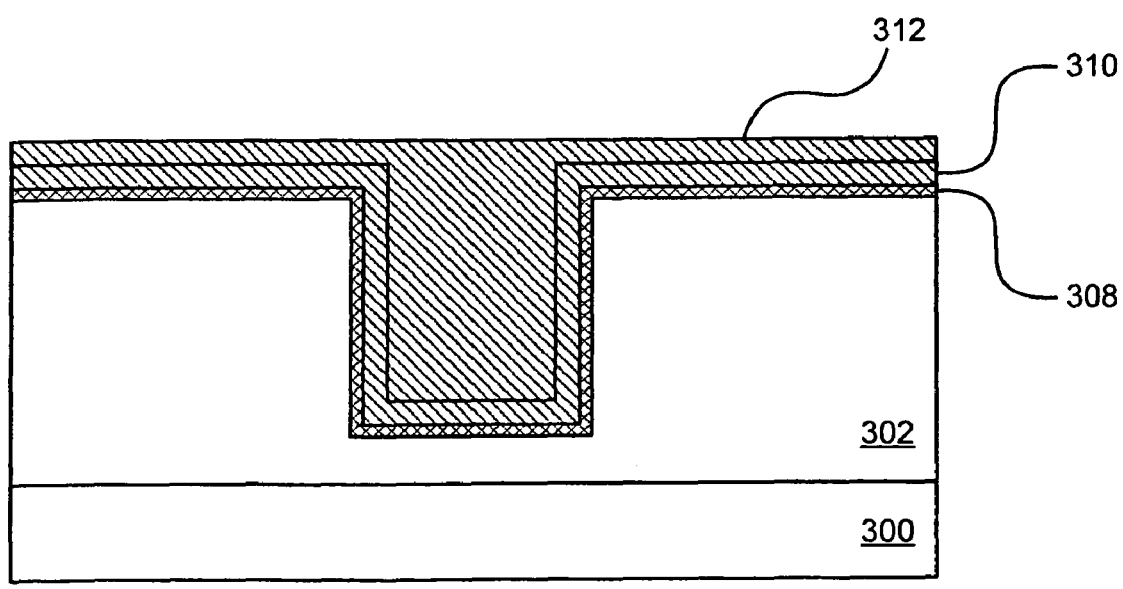
FIG. _3D

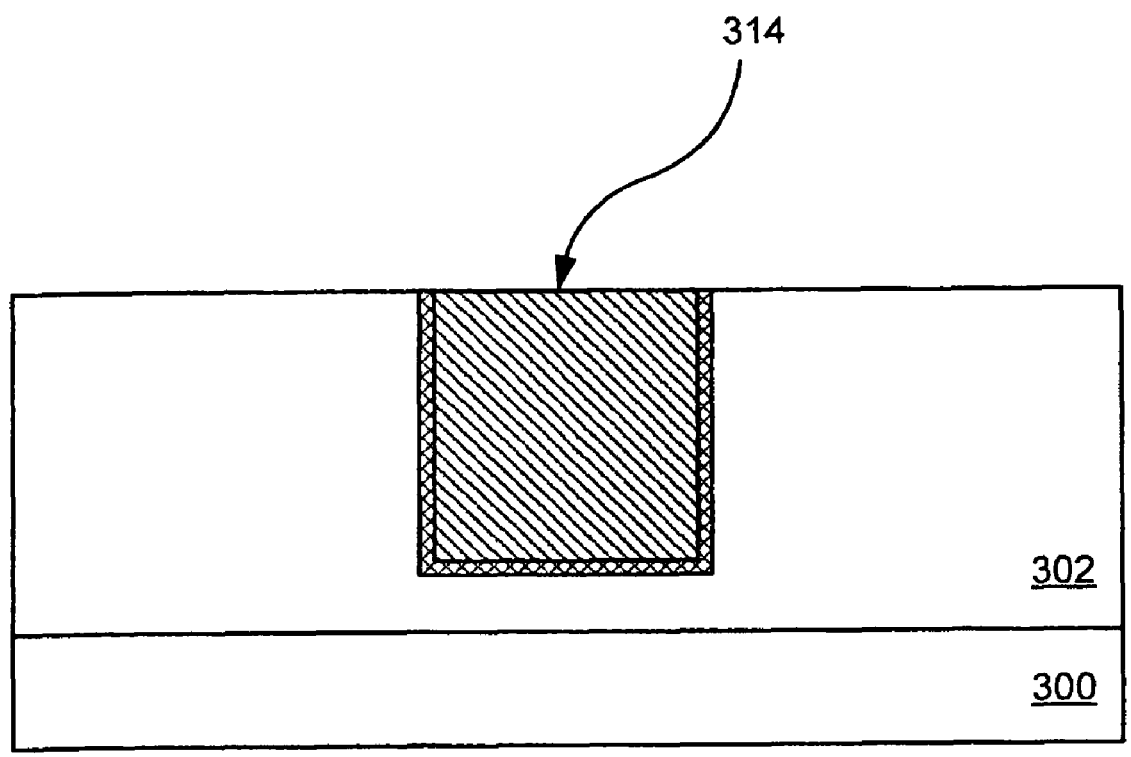
FIG._3E

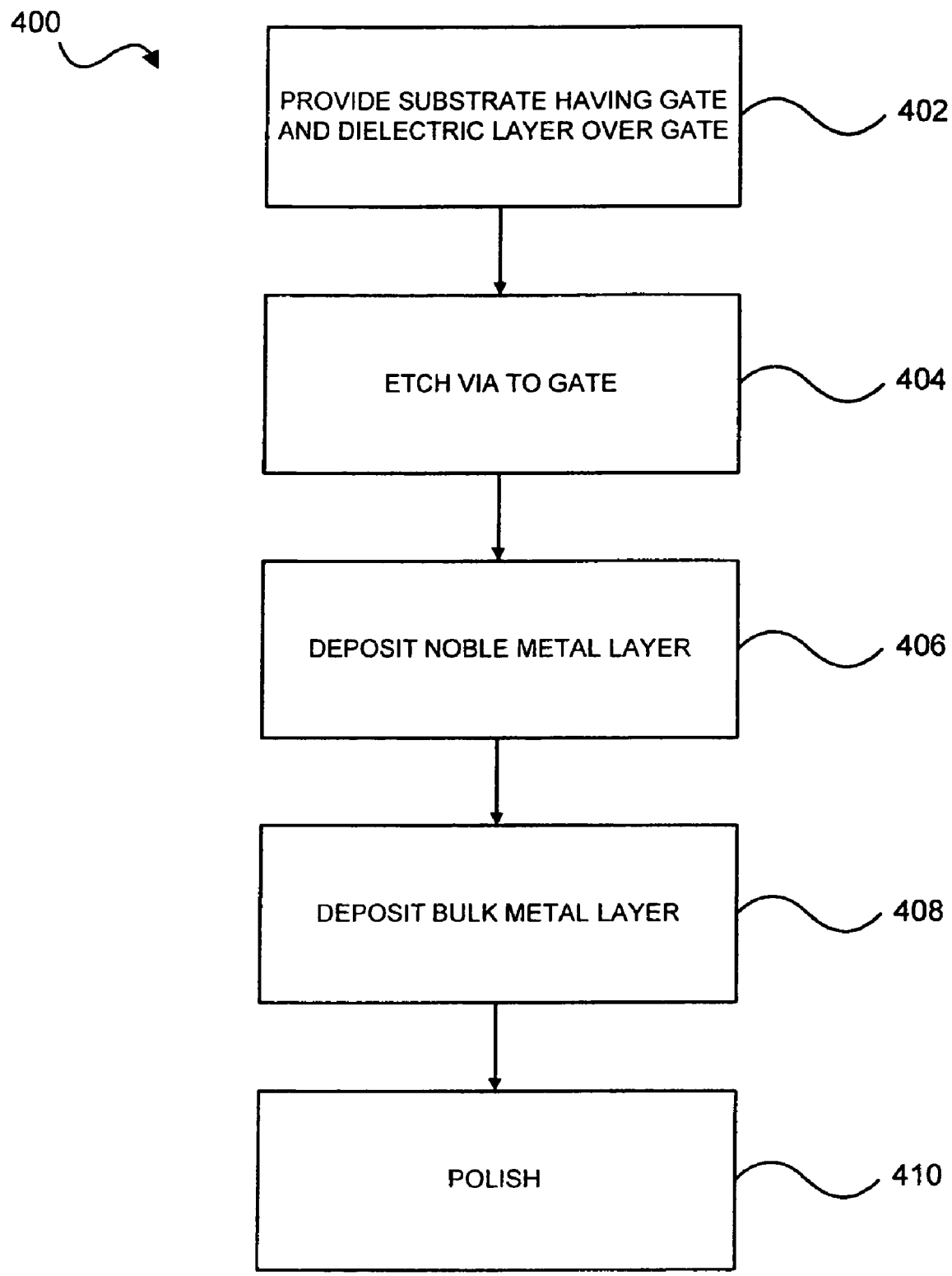
FIG._4

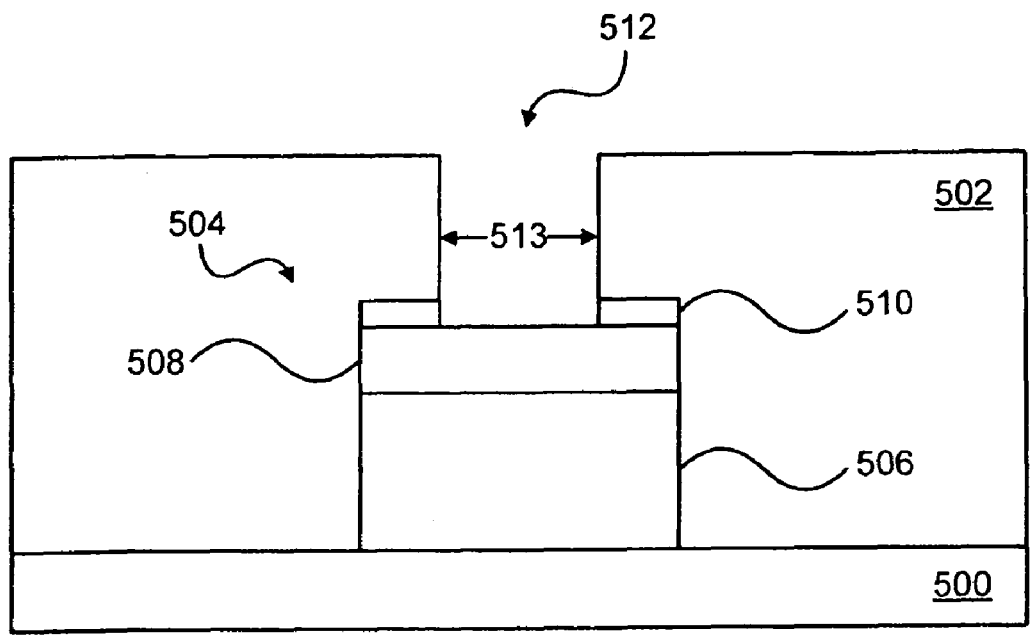
FIG._5A
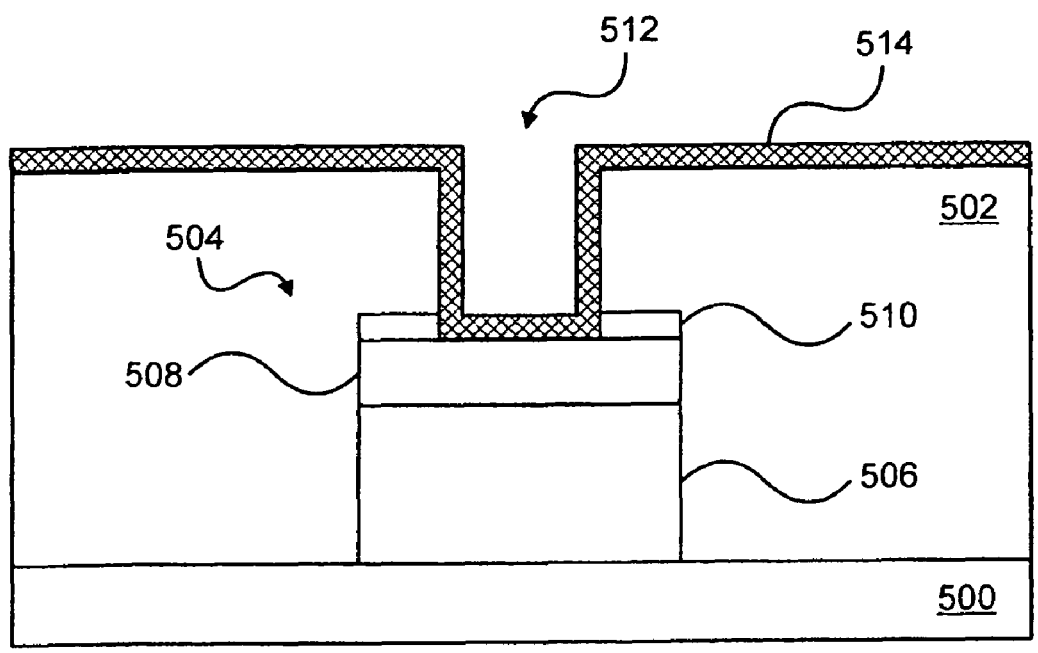
FIG._5B

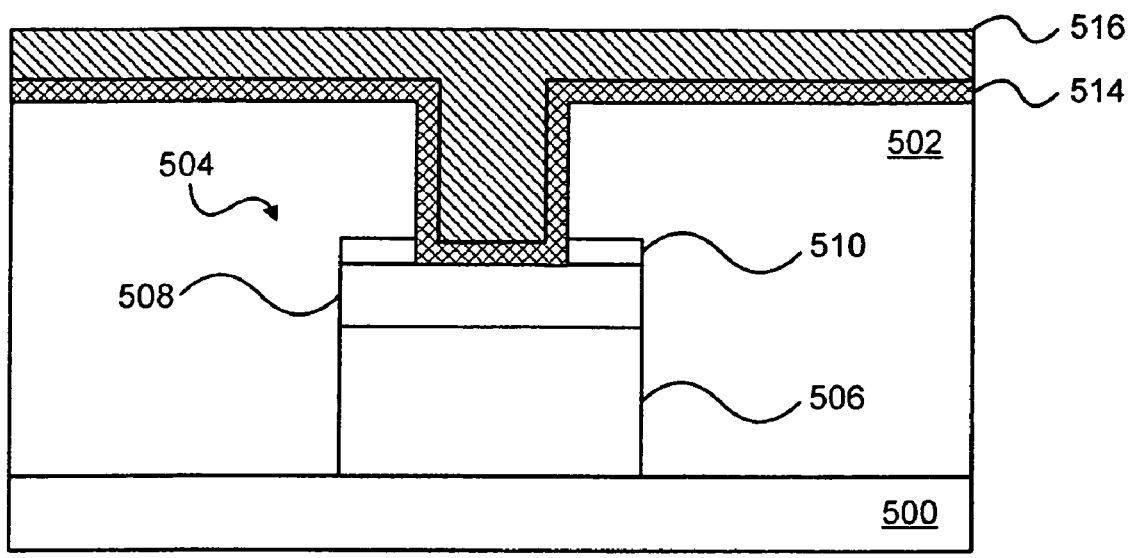
FIG._5C
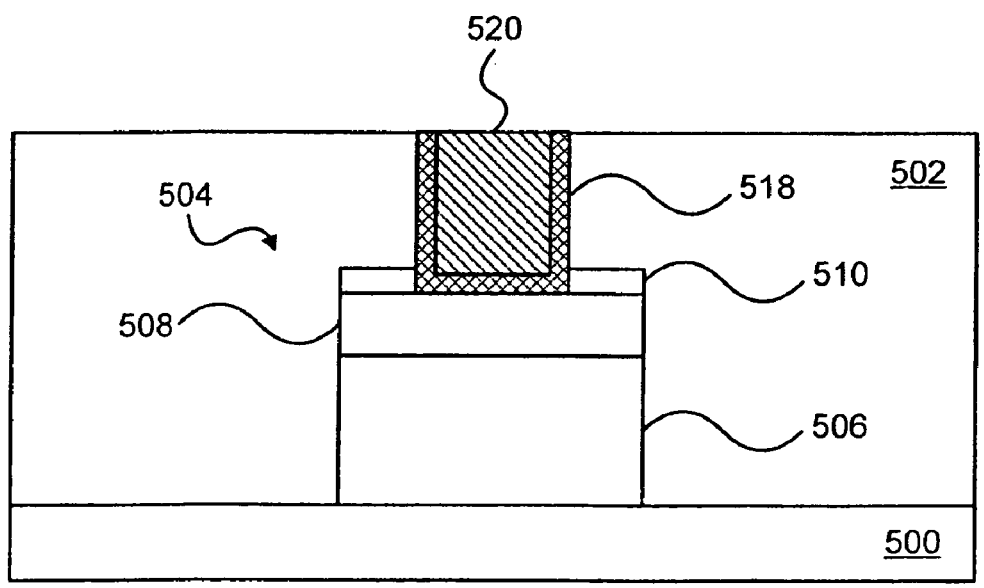
FIG._5D

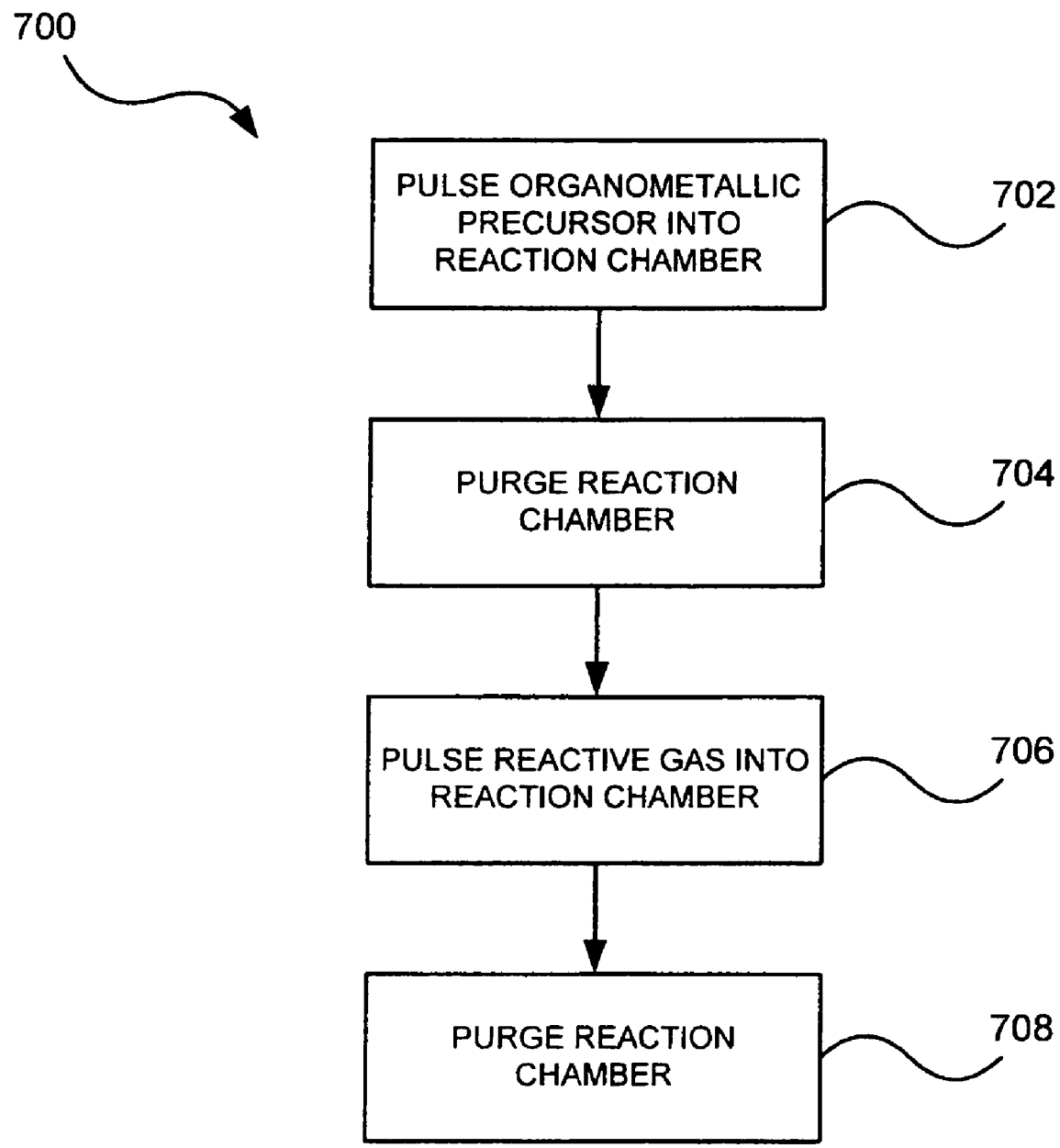
FIG._7

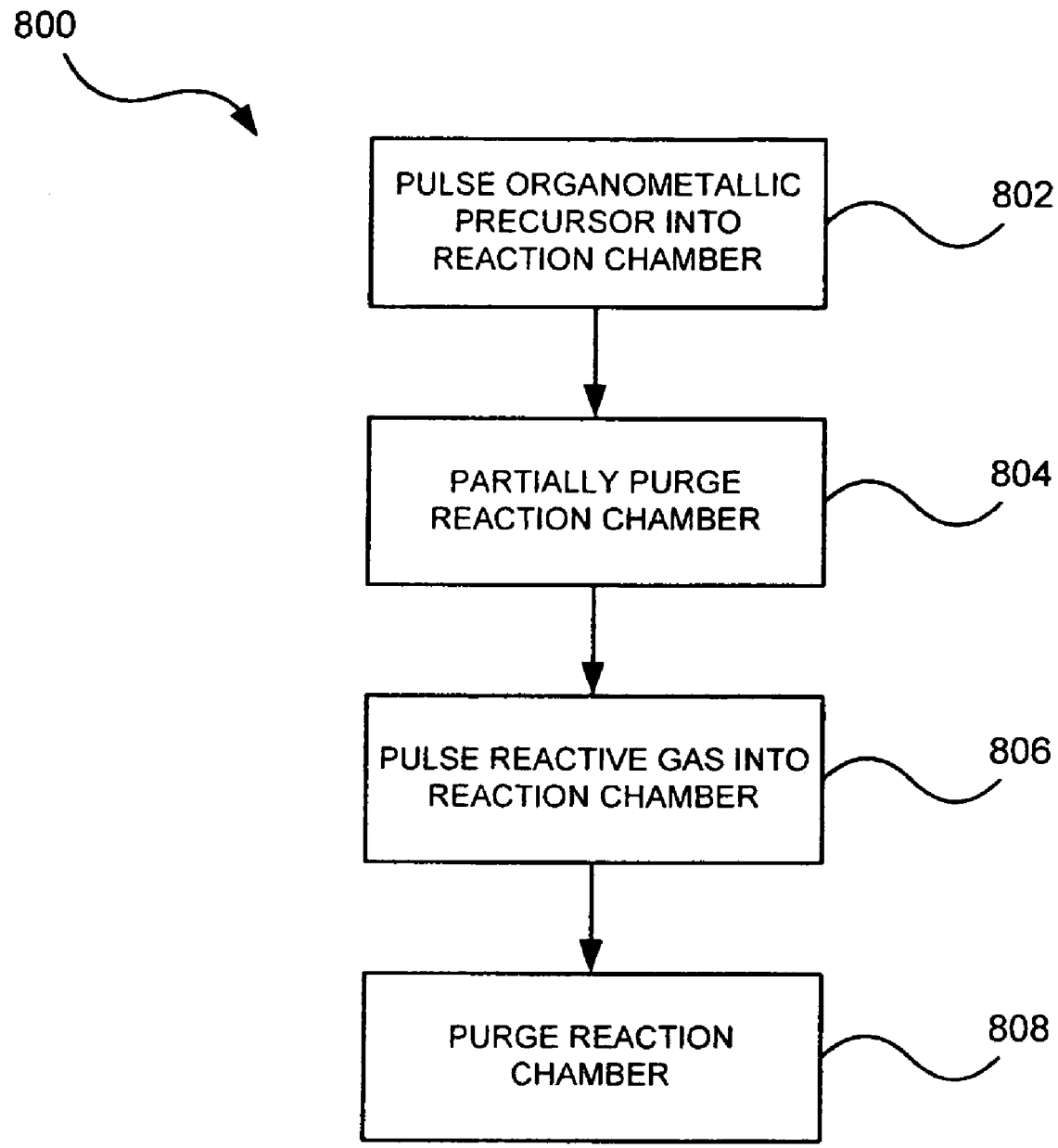
FIG._8

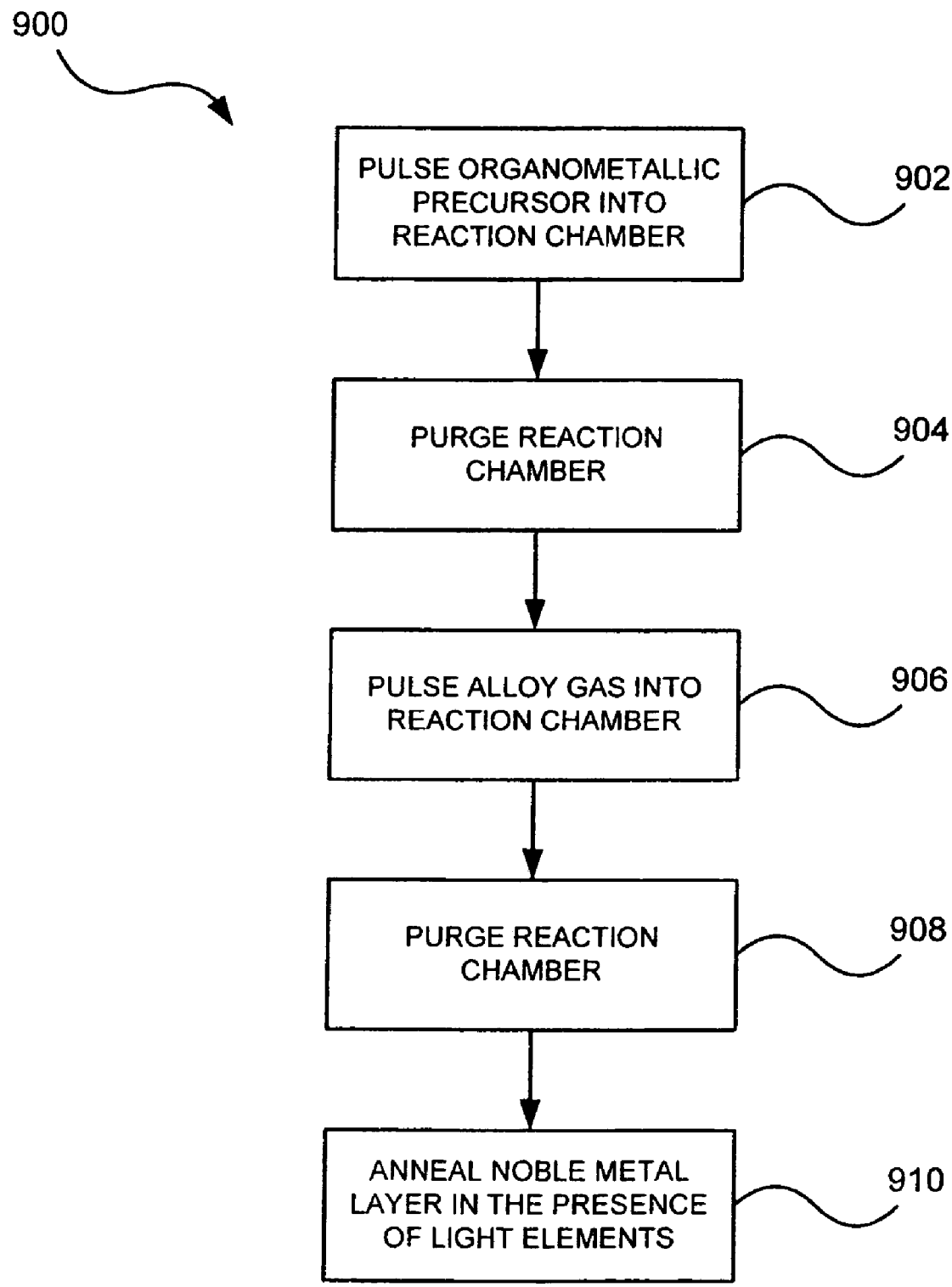
FIG._9

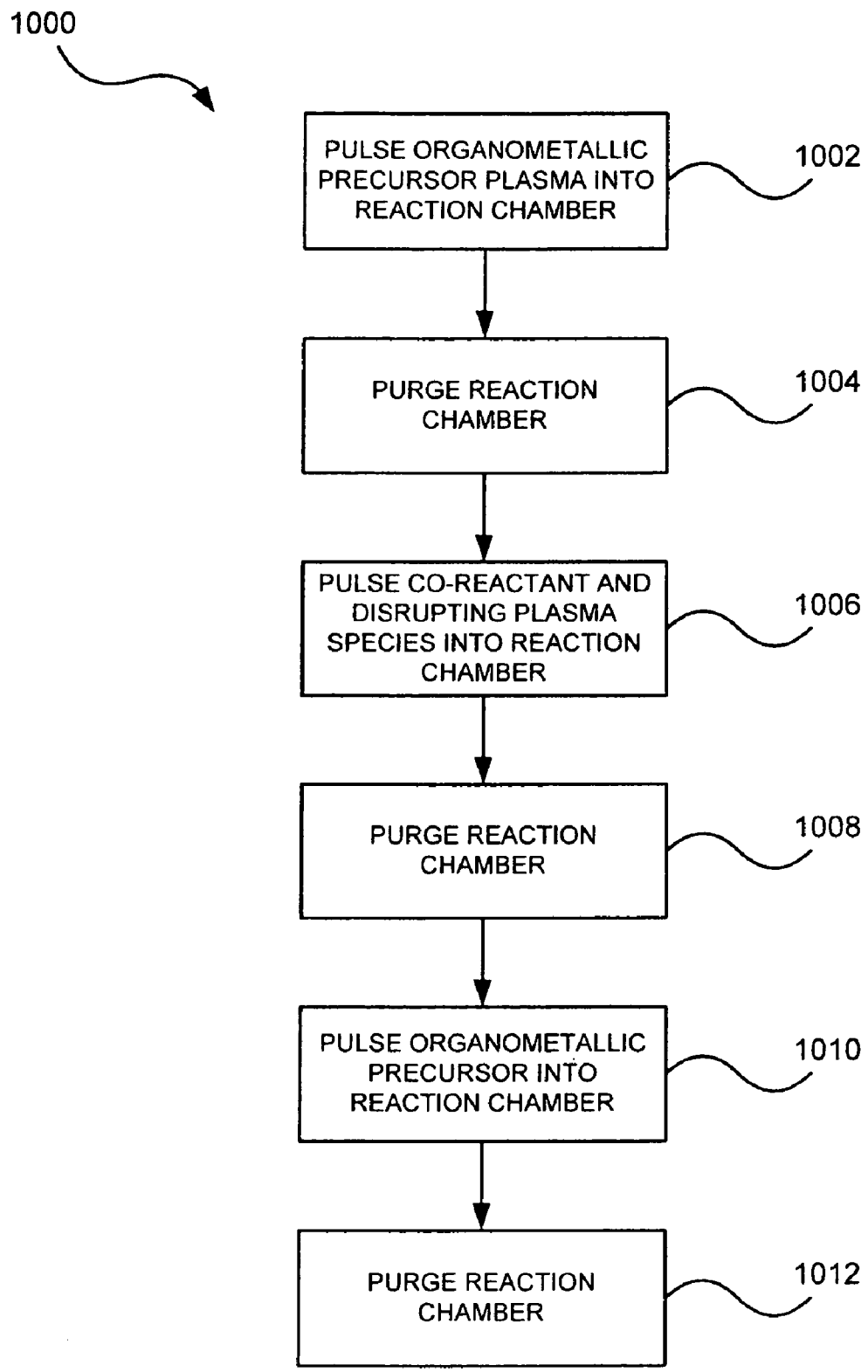
FIG._10

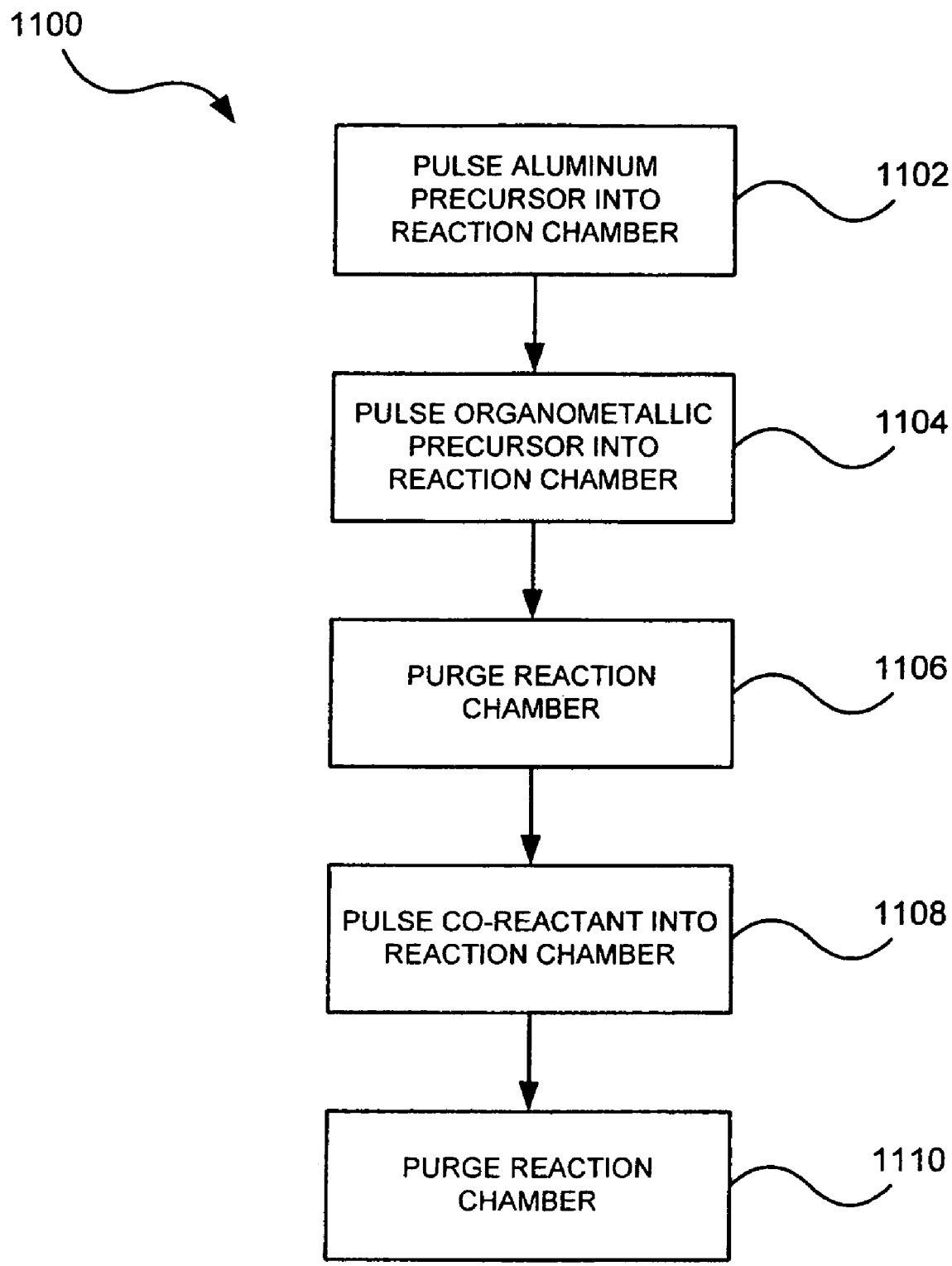
FIG._11

US 8,222,746 B2

NOBLE METAL BARRIER LAYERS

RELATED APPLICATION

The present application is a continuation-in-part of U.S. patent application Ser. No. 11/367,160 filed Mar. 3, 2006, entitled "NOBLE METAL PRECURSORS FOR COPPER BARRIER AND SEED LAYER". U.S. patent application Ser. No. 11/367,160 is incorporated herein by reference.

BACKGROUND

In the manufacture of integrated circuits, copper interconnects are generally formed on a semiconductor substrate using a copper damascene process (e.g., a dual damascene process which is well known in the art). In this process, a trench is etched into a dielectric layer and the trench is filled with a barrier layer, an adhesion layer, and a seed layer. For instance, a physical vapor deposition (PVD) process, such as a sputter process, may be used to deposit a non-conformal tantalum nitride barrier layer and a non-conformal tantalum adhesion layer (i.e., a TaN/Ta stack) into the trench. This may be followed by a PVD sputter process to deposit a non-conformal copper seed layer into the trench. An electroplating process may then be used to fill the trench with copper metal and a chemical mechanical polishing (CMP) process may be used to remove excess metal and complete formation of the interconnect.

As device dimensions scale down, the aspect ratio of the trench becomes more aggressive as the trench becomes more narrow. This gives rise to issues in the copper seed deposition and plating processes such as trench overhang, resulting in pinched-off trench openings and inadequate gapfill. For instance, the "line-of-sight" deposition method used during the PVD of the copper seed layer contributes to pinching off the trench openings. One approach to addressing these issues utilizes electroless deposition processes to deposit copper into the narrow trenches. Electroless deposition processes permit copper seed or copper gapfill deposition directly on the TaN/Ta stack. Eliminating the metal seed layer widens the available gap for subsequent metallization.

Reducing the thickness of the TaN/Ta stack is another approach to widening the available gap for metallization. In known processes, the Ta adhesion layer is required because metals deposited using conventional vapor deposition processes do not readily nucleate on the TaN barrier layer, leading to problems such as film delamination or agglomeration. Unfortunately, thinner films of TaN/Ta that have been evaluated are limited by the non-conformal characteristic of PVD deposition techniques. Accordingly, alternative techniques for reducing the thickness of the TaN/Ta stack are needed.

BRIEF DESCRIPTION OF THE DRAWINGS

FIGS. 1A and 1B illustrate drawbacks to conventional methods for forming an interconnect.

FIG. 2 is a method of forming a copper interconnect in accordance with an implementation of the invention.

FIGS. 3A to 3E illustrate structures that are formed when carrying out the method of FIG. 2.

FIG. 4 is a method of forming a via to contact a gate electrode in accordance with an implementation of the invention.

FIGS. 5A to 5D illustrate structures that are formed when carrying out the method of FIG. 4 in accordance with an implementation of the invention.

FIG. 7 is a method for forming a noble metal layer in accordance with an implementation of the invention.

FIG. 8 is a method for forming a noble metal layer in accordance with another implementation of the invention.

FIG. 9 is a method for forming an alloyed noble metal layer in accordance with one implementation of the invention.

FIG. 10 is a method for forming an amorphous noble metal layer in accordance with an implementation of the invention.

FIG. 11 is a method for forming a noble metal layer with an aluminum precursor in accordance with an implementation of the invention.

DETAILED DESCRIPTION

Figure 6:
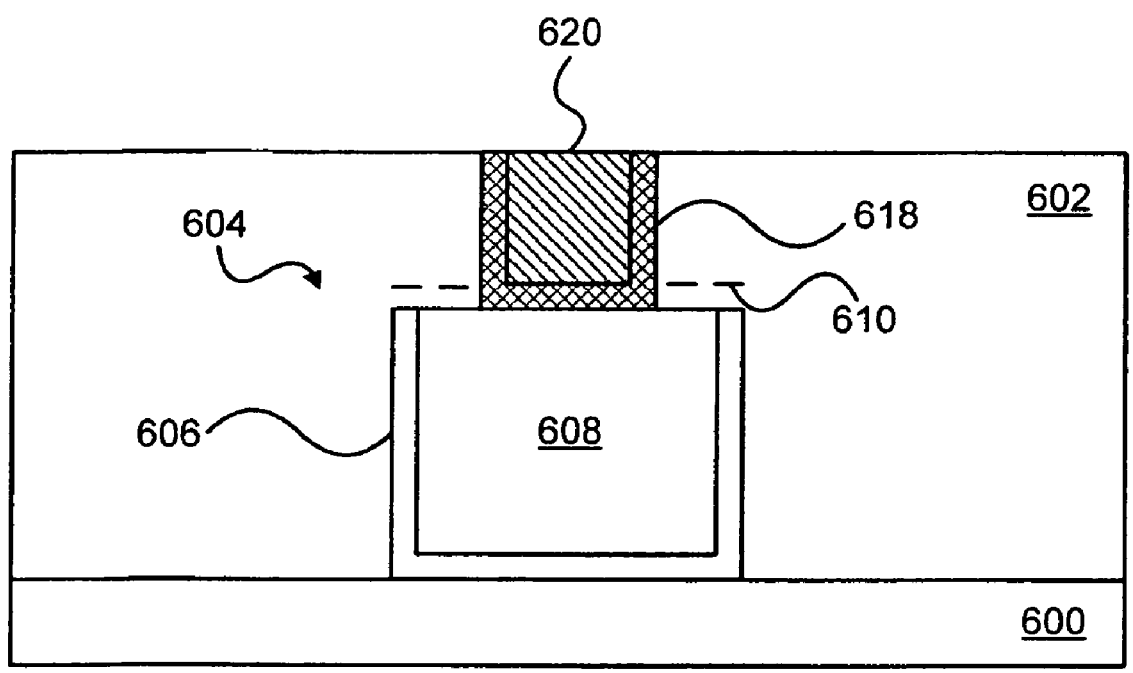
FIG. 6 illustrates a structure that is formed when carrying out the method of FIG. 4 in accordance with another implementation of the invention.

Described herein are systems and methods of forming a single noble metal layer that provides an adhesion layer for copper deposition while preventing the copper from diffusing into an underlying dielectric layer. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention include an ultra thin layer formed from a noble metal that functions as both a copper barrier layer and a copper adhesion layer. For purposes of this disclosure, the term "noble metal" will refer to any of at least the following metals: iridium (Ir), platinum (Pt), palladium (Pd), rhodium (Rh), osmium (Os), gold (Au), silver (Ag), rhenium (Re), ruthenium (Ru), tungsten (W), and nickel (Ni). Additional metals that may be classified as conventional noble metals may be used as well. In various implementations, the thickness of the noble metal layer may range from 3 Angstroms (Å) to 100 Å, with a thickness of less than 50 Å being most common.

For reference, FIGS. 1A and 1B illustrate a common problem with conventional damascene processes for forming copper interconnects. Turning to FIG. 1A, a semiconductor wafer 100 is shown that includes a dielectric layer 102. A trench 104 is etched into the dielectric layer 102 and includes a gap 106 through which metal may enter the trench 100 during metallization processes.

In accordance with a conventional damascene process, a barrier layer 108 and an adhesion layer 110 are formed within the trench 104. The barrier layer 108 is generally formed using a material such as tantalum nitride (TaN) and prevents copper metal from diffusing into the dielectric layer 102, which would likely reduce performance of the interconnect and may lead to electrical shorts. The adhesion layer 110 is generally formed using a metal such as tantalum (Ta) or ruthenium (Ru) and enables copper metal to become deposited onto the barrier layer 108. Copper metal generally does not adhere and thus is not deposited directly onto TaN, therefore the adhesion layer 110 acts as an intermediary to bind the copper metal to the barrier layer 108. As shown in FIG. 1A, the deposition of the TaN barrier layer 108 and the adhesion layer 110, a combination that is often referred to as a TaN/Ta stack 108/110 or a TaN/Ru stack, narrows the available gap 106 for subsequent metallization.

FIG. 1A also illustrates the trench 104 after a copper seed layer 112 has been deposited onto the adhesion layer 110. As shown in FIG. 1A, the deposition of the copper seed layer 112 further reduces the available gap 106 for subsequent metallization.

Turning to FIG. 1B, one problem created by a narrowed gap 106 for metallization is illustrated. A plating process is used to deposit a bulk copper layer 114 into the trench 104 to form a copper interconnect. The copper metal enters the trench 104 through the gap 106 where, due to the narrow width of the gap 106, issues such as trench overhang and pinching off of the trench opening often occur that lead to defects. For instance, as shown in FIG. 1B, trench overhang may occur that pinches off the opening of the trench 104, creating a void 116 that will appear in the final interconnect structure.

Accordingly, implementations of the invention provide a damascene process that widens the gap available for metallization, thus reducing the likelihood of trench overhang and reducing the occurrence of voids and other defects in the final interconnect structure. To widen the gap available for metallization, implementations of the invention utilize a single noble metal layer in place of the conventional, two-layer, TaN/Ta stack. The single noble metal layer functions as both a barrier to copper diffusion and as an adhesion layer for copper deposition, eliminating the need for the TaN/Ta stack 108/110. The end result is a thinner barrier/adhesion layer that widens the trench gap available for metallization, thereby enabling improved copper gapfill in narrower trenches with aggressive aspect ratios.

FIG. 2 is a method 200 of forming a copper interconnect using a noble metal layer in place of conventional barrier and adhesion layers, in accordance with an implementation of the invention. FIGS. 3A to 3E illustrate various structures that are formed while carrying out the processes of the method 200. For clarity, the method 200 of FIG. 2 will be described in association with the structures shown in FIGS. 3A to 3E.

First, a semiconductor substrate is provided that includes a dielectric layer (process 202 of FIG. 2). The dielectric layer provides insulation between electrical components. As semiconductor device dimensions decrease, electrical components such as interconnects must be formed closer together. This increases the capacitance between components with the resulting interference and crosstalk degrading device performance. To reduce the interference and crosstalk, dielectric materials with lower dielectric constants (i.e., low-k dielectric materials) are used to provide insulation between electrical components. Common dielectric materials that may be used in the dielectric layer 102 include, but are not limited to, oxides such as silicon dioxide ($SiO_2$) and carbon doped oxide (CDO), organic polymers such as perfluorocyclobutane (PFCB), or fluorosilicate glass (FSG).

The dielectric layer is patterned to include at least one trench for use in forming a copper interconnect by way of a damascene process (process 204). Conventional photolithography techniques may be used to etch the trench into the dielectric layer. As is well known in the art, one photolithography technique includes depositing a photoresist material onto the dielectric layer, exposing the photoresist material to ultraviolet radiation using a patterned mask, developing the photoresist material, etching the dielectric layer, and removing the photoresist material. The photoresist material that remains after development functions as a mask to allow only selected portions of the dielectric layer to be etched, thereby forming structures such as the trench.

Turning to FIG. 3A, a semiconductor wafer 300 is shown that includes a dielectric layer 302. A trench 304 is etched into the dielectric layer 302 and includes a gap 306 through which metal may enter the trench 302 during one or more metallization processes.

Next, a noble metal layer is deposited within the trench (process 206). As mentioned above, the noble metal layer replaces the conventional TaN/Ta stack. In implementations of the invention, the noble metal layer may be an ultra-thin film formed from metals that include, but are not limited to, Ir, Pt, Pd, Rh, Os, Au, Ag, Re, Ru, W, and Ni. The thickness of the noble metal layer may range from 3 Å to 100 Å, with a thickness of less than 50 Å being preferred. In some implementations, the density of the noble metal layer may be greater than or equal to 5 grams per cubic centimeter ($g/cm^3$) and preferably greater than 19 $g/cm^3$. The noble metal layer may be deposited directly upon the dielectric layer and a copper interconnect may then be formed directly upon the noble metal layer. Various methods for depositing the noble metal layer in accordance with the invention are described below.

FIG. 3B illustrates a single noble metal layer 308 formed within the trench 304. The single noble metal layer 308 functions as both a barrier to copper diffusion and as an adhesion layer for copper deposition, eliminating the need for the TaN/Ta stack 108/110. In some implementations, the noble metal layer 308 may further be used as a seed layer for the subsequent copper deposition, thereby eliminating the need for a copper seed layer. The end result is a thinner barrier/adhesion layer that widens the trench gap available for metallization, thereby enabling improved copper gapfill in narrower trenches with aggressive aspect ratios.

A copper seed layer may then be deposited upon the noble metal layer (process 208). The copper seed layer is generally deposited using a physical vapor deposition process (PVD). Other deposition processes may also be used to deposit the copper seed layer, such as a chemical vapor deposition (CVD) process, an atomic layer deposition (ALD) process, or an electroless process. During the vapor deposition process, the copper is able to nucleate on the surface of the noble metal layer. The copper seed layer then enables or catalyzes a subsequent plating process to fill the interconnect with copper metal. As mentioned above, however, in some implementations the noble metal layer may function as the seed layer, rendering a separate copper seed layer unnecessary.

FIG. 3C illustrates the trench 304 after a copper seed layer 310 has been deposited onto the noble metal layer 308. As shown in FIG. 3C, after deposition of the copper seed layer 310, the gap 306 available for metallization is significantly wider than the narrow gap 106 created during the conventional damascene process (see FIG. 1A).

A bulk copper layer is then deposited over the copper seed layer to fill the trench with copper (process 210). Generally, an electroplating process or an electroless plating process is used to deposit the bulk copper layer. The copper metal enters the trench through the gap where, due to the relatively larger width of the gap, issues such as trench overhang are reduced or eliminated.

FIG. 3D illustrates the trench 304 after a bulk copper layer 312 has been deposited on the copper seed layer 310 using an electroplating process or an electroless plating process. As shown, the bulk copper layer 312 fills the trench 304 without voids.

Finally, a chemical mechanical polishing (CMP) process may be used to planarize the deposited copper metal and form the final copper interconnect structure (process 212). FIG. 3E illustrates the formation of a copper interconnect 314 after the CMP process is used to planarize the deposited bulk copper layer 312, as well as portions of the copper seed layer 310 and the noble metal layer 308.

FIG. 4 is a method 400 of forming an interconnect, in particular a via to contact a gate electrode, using a noble metal layer in place of conventional barrier and adhesion layers, in accordance with an implementation of the invention. FIGS. 5A to 5D illustrate various structures that are formed while carrying out the processes of the method 400. For clarity, the method 400 of FIG. 4 will be described in association with the structures shown in FIGS. 5A to 5D.

First, a semiconductor substrate is provided that includes a gate electrode and a dielectric layer over the gate electrode (process 402 of FIG. 4). Common dielectric materials that may be used in the dielectric layer include, but are not limited to, oxides such as silicon dioxide ($SiO_2$) and carbon doped oxide (CDO), organic polymers such as perfluorocyclobutane (PFCB), or fluorosilicate glass (FSG).

The dielectric layer is etched or otherwise patterned to include at least one via opening for use in forming a copper, aluminum, or other conductive metal interconnect to contact the gate by way of a damascene process (process 404). Conventional photolithography techniques may be used to etch the via opening into the dielectric layer. As is well known in the art, one photolithography technique includes depositing a photoresist material onto the dielectric layer, exposing the photoresist material to ultraviolet radiation using a patterned mask, developing the photoresist material, etching the dielectric layer, and removing the photoresist material. The photoresist material that remains after development functions as a mask to allow only selected portions of the dielectric layer to be etched, thereby forming structures such as the via opening.

Turning to FIG. 5A, a semiconductor wafer 500 is shown that includes a particular example of a suitable gate electrode 504 and a dielectric layer 502 over the gate electrode. The particular gate electrode illustrated includes a polycrystalline silicon or polysilicon gate 506, a silicon-metal alloy or silicide layer 508 over the polysilicon gate, and a nitride of silicon layer 510 over the silicide layer. The polysilicon gate may be either n-type or p-type. The polysilicon gate may be either doped or undoped. Various concentrations of either n-type or p-type dopant are suitable. Examples of suitable metals for the silicide layer include, but are not limited to, nickel, cobalt, titanium, molybdenum, platinum, tungsten, tantalum, and the like, and various combinations thereof. The silicon-metal alloy or silicide layer may provide good electrical conductivity, which is at least greater than that of the underlying polysilicon. The nitride of silicon layer, such as, for example, one including $Si_3N_4$, may be thinner than the silicide layer, and may serve as an etch stop hard mask for the underlying silicide. In alternate embodiments of the invention, either the nitride of silicon layer, or the silicide layer, or both, may optionally be omitted. Various examples of such gate electrodes are known in the arts.

A via opening 512 is etched into the dielectric layer 502 and includes a gap 513 through which metal may enter the via opening during one or more metallization processes. As shown, the via opening may extend partially or fully through the nitride of silicon layer so that the bottom lands on the silicide layer. This may tend to promote good electrical conductivity between the metal via and the silicide. Alternatively, the via opening may extend to or partly through the nitride of silicon layer.

Next, a noble metal layer is deposited within the via opening (process 406). As mentioned above, the noble metal layer replaces the conventional TaN/Ta stack. In implementations of the invention, the noble metal layer may be an ultra-thin film formed from metals that include, but are not limited to, Ir, Pt, Pd, Rh, Os, Au, Ag, Re, Ru, W, and Ni. In an implementation of the invention, the noble metal layer may include Ir, Os, Rh, Pt, Pd, or various combinations thereof potentially with other metals. In an implementation of the invention, the noble metal layer may include Ir, Os, and Rh, or various combinations thereof potentially with other metals. In an implementation of the invention, the noble metal layer may include Ir. The thickness of the noble metal layer may range from 3 Å to 100 Å, with a thickness of less than 50 Å being preferred. In an implementation of the invention, the thickness may be substantially conformal, meaning more conformal than a tantalum adhesion layer produced by a conventional sputter process into a similar sized and shaped via. In an implementation of the invention, the noble metal layer may be deposited using atomic layer deposition (ALD). In some implementations, the density of the noble metal layer may be greater than or equal to 5 grams per cubic centimeter ($g/cm^3$) and preferably greater than 16 $g/cm^3$, and sometimes greater than 19 $g/cm^3$. In an implementation of the invention, approaches described further below may be used to densify the noble metal layer, saturate grain boundaries, or otherwise improve the barrier properties of the noble metal layer. The noble metal layer may be deposited directly upon the dielectric layer on the top surface of the substrate, deposited directly on the dielectric layer on the vertical sidewalls of the via opening, and deposited on either the silicide layer (as shown) or the nitride layer at the bottom of the via opening. Various methods for depositing the noble metal layer in accordance with the invention are described below. A copper or other highly conductive interconnect may then be formed directly upon the noble metal layer.

FIG. 5B illustrates a single noble metal layer 514 formed within the via opening 512. The single noble metal layer 514 may function as both a barrier to copper or aluminum diffusion and as an adhesion layer for copper or aluminum, eliminating the need for the TaN/Ta stack 108/110. In some implementations, the noble metal layer 514 may further be used as a seed layer for the subsequent copper deposition, thereby eliminating the need for a copper seed layer. The end result is a thinner barrier/adhesion layer that widens the gap available for metallization, thereby enabling improved gapfill in narrower via openings with aggressive aspect ratios.

If desired, a copper seed layer (not shown) may then be deposited upon the noble metal layer. The copper seed layer is generally deposited using a physical vapor deposition process (PVD). Other deposition processes may also be used to deposit the copper seed layer, such as a chemical vapor deposition (CVD) process, an atomic layer deposition (ALD) process, or an electroless process. During the vapor deposition process, the copper is able to nucleate on the surface of the noble metal layer. The copper seed layer then enables or catalyzes a subsequent plating process to fill the interconnect with copper metal. As mentioned above, however, in some implementations the noble metal layer may function as the seed layer, rendering a separate copper seed layer unnecessary.

A bulk metal layer, such as, for example, one of copper, aluminum, or another conductive metal, is then deposited or otherwise formed over the noble metal layer, or over the seed layer if one is present, to fill the via opening with bulk metal (process 408). Generally, an electroplating process or an electroless plating process is used to deposit the bulk copper layer. The copper metal enters the via opening through the gap where, due to the relatively larger width of the gap, issues such as overhang are reduced or eliminated.

FIG. 5C shows a bulk metal layer 516, such as a copper layer, aluminum layer, or other conductive metal layer, deposited on the noble metal layer in the via opening using an electroplating process or an electroless plating process or other deposition process. As shown, the bulk metal layer 516 fills the via opening 512 without voids.

Finally, a polishing process, such as chemical mechanical polishing (CMP), may be used to planarize the deposited copper or other bulk metal and form the final interconnect structure (process 410). FIG. 5D illustrates the formation of an interconnect after the CMP process is used to planarize the deposited bulk metal layer 516, as well as portions of the noble metal layer 514. The interconnect includes a copper or other bulk metal plug 520 and a noble metal barrier and adhesion layer 518.

The scope of the invention is not limited to the particular gate electrode shown and described above. Other examples of suitable gate electrodes are known in the arts. To further illustrate, another example of a suitable gate electrode will be described briefly.

Turning now to FIG. 6, a semiconductor wafer 600 is shown that includes a replacement metal gate electrode 604 and a dielectric layer 602 over the replacement metal gate electrode. The replacement metal gate electrode 604 includes a work function layer 606 and a bulk metal plug 608. Examples of suitable bulk metals for the plug 608 include, but are not limited to, copper, aluminum, tungsten, and the like, and various combinations thereof. The work function layer 606 may include a material having a work function suitable for that of the underlying material. As shown, the work function layer 606 may be relatively thin and disposed between the bulk metal plug 608 and the underlying substrate 600. In some implementations, the work function layer 606 may be disposed on the vertical sidewalls of the replacement metal gate electrode 604, although this is not required. The replacement metal gate electrode 604 may optionally include a nitride of silicon cap 610, although this is not required.

The noble metal layer 618 of the filled via is formed over the replacement metal gate electrode 604. The noble metal layer may directly contact the bulk metal plug 608. If the nitride of silicon layer 610 is present, the via opening may optionally be etched at least partially or fully through the nitride of silicon layer to promote good conductivity. A bulk metal plug 620 may be formed over, and as shown optionally directly on, the noble metal layer 618. By way of example, the bulk metal plug 620 may be formed by PVD, CVD, ALD, plating, or electroless plating, followed by optional planarization if the top is not sufficiently planar.

The silicon-metal alloy or silicide layer may provide good electrical conductivity, which is at least greater than that of the underlying polysilicon. The nitride of silicon layer, such as, for example, one including $Si_3N_4$, may be thinner than the silicide layer, and may serve as an etch stop hard mask for the underlying silicide. In alternate embodiments of the invention, either the nitride of silicon layer, or the silicide layer, or both, may optionally be omitted. Various examples of such gate electrodes are known in the arts.

For purposes of illustration, a uniformly shaped via have been shown and described. It should be appreciated that not all vias are uniform in shape. In some the width may change with depth. For example, the bottom may be wider than the top. As another example, the via may have a boot shape, or other non-uniform shape. Implementations of the invention are suitable for non-uniform shaped vias as well as for uniform shaped vias.

In accordance with implementations of the invention, the noble metal layer may be formed using one or more organometallic precursors in an atomic layer deposition (ALD) process or a chemical vapor deposition (CVD) process. The organometallic precursor contains the specific noble metal that is desired for the noble metal layer. The deposition of noble metals using ALD or CVD methods has been previously demonstrated and noble metals may be deposited as pure materials due to the catalytic nature of the metal.

The organometallic precursor used in the ALD or CVD process to form a noble metal layer may take the form of a carbonyls, allyls, beta-diketonates, aryls, metallocenes, alkyls, alkenes, hydrides, amides, arenes, halides, pentadienyls, as well as combinations thereof. Other forms of noble metal containing organometallic precursors that are suitable for ALD and CVD processes may be used as well.

For instance, if the desired noble metal is Ir, organometallic precursors that may be used in an ALD or a CVD process include, but are not limited to, chlorocarbonylbis(triphenylphosphine)iridium, chloro-1,5-cyclooctadieneiridium, 1,5-cyclooctadiene(acetylacetonato)iridium, dicarbonylacetonatoiridium, hydrocarbonyltris(triphenylphosphine)iridium, iridium acetylacetonate, $Ir_4(CO)_{12}$, $Ir_6(CO)_{16}$, $Ir(allyl)_3$, (methylcyclopentadienyl)(1,5-cyclooctadiene)iridium, tris(norbornadiene)(acetylacetonato)iridium, $Ir(CO)_2Cl_4$, $Ir(CO)_2Br_4$, $IrI(CO)_3$, $HIr(CO)_4$, $CpIr(CO)_2$, Pyrrolyl-Ir—$(CO)_2$—Cl, and ligand variations thereof including, but not limited to, allyls, cyclohexadienyl, indenyl, and pentamethylCp (where Cp=cyclopentadienyl). Further Ir containing organometallic precursors include, but are not limited to, (cod)IrCp, $Ir(cod)_2Br$, $CpIr(Pyrrolyl)_3$, hexadienyl-Ir(Cp), fr(allyl)pyrroryl$_2$, and $IrH_5(PEt_3)_2$.

If the desired noble metal is Rh, organometallic precursors that may be used in an ALD or a CVD process include, but are not limited to, $Rh_3(CO)_{12}$, $RhBr_3(CO)$, $RhI_3(CO)$, $RhCl_3(CO)$, $Rh(CO)_2(NH_2)Cl$, $Rh(CO)_3I$, $Rh(CO)_3Br$, $Rh(CO)_3Cl$, $Rh(allyl)(CO)_2$, and cyclohexadienyl-Rh—$(CO)I_2$. Further Rh containing organometallic precursors include, but are not limited to, $Rh(allyl)(CO)_2$, allyl-$Rh(PF_3)_3$, CpRh(allyl)Cl, $Rh(allyl)_3$, cod-Rh-allyl, $Rh_2$(allyl)$_4Cl_2$, $Rh(allyl)_4(OAc)_2$, $Rh(C_2H_4)_4Br_2$, $CpRh(C_2H_4)PMe_3$, (cod)Rh(Cp), (Cp)Rh(acac)Cl, $RhCp_2I_4$, $RhCp_2Br_4$, and Cp-Rh(Cl)$_2$(PPh$_3$).

If the desired noble metal is Pt, organometallic precursors that may be used in an ALD or a CVD process include, but are not limited to, $Pt(CO)_2Cl$, $Pt(CO)_2Br$, $PtMe_2(CO)_2$, $Pt(PMe_3)(CO)Cl_2$, Pt-cyclohexadienyl-(CO)—I, $Pt(allyl)_2$, $Pt_2I_2(allyl)_2$, $Pt_2Br_2(allyl)_2$, allyl-Pt—(PPh$_3$)Cl, $Pt(OH)_2Me_2$, $Cl_2PtC_2H_4(PPh_3)$, $Me_4Pt(PMe_2Ph)_2$, $(MeOCH_2C_2H_4)Pt(PMe_2Ph)_2$, and $(Me)_2Pt(PMePh_2)_2$.

If the desired noble metal is Pd, organometallic precursors that may be used in an ALD or a CVD process include, but are not limited to, $PdI_2(CO)_2$, $PdCl_2(CO)_2$, and $Pd(CO)_2(C_4F_6)$.

If the desired noble metal is Os, organometallic precursors that may be used in an ALD or a CVD process include, but are not limited to, $Os(CO)_2(NO)_2$, $Os(CO)_4Br_2$, $OS(CO)_5$, Cp-Os—$(CO)_2$—I, Cp-Os—$(CO)_2$—Cl, Cp-Os—$(CO)_2$—Br, SiMe$_3$-Os—$(CO)_4$—I, and SiMe$_3$-Os—$(CO)_4$—Br.

As will be apparent to those of ordinary skill in the art, in the precursor lists provided above, Cp represents cyclopentadienyl, Me represents methyl, Et represents ethyl, Pr represents propyl, Ph represents phenyl, allyl represents $C_3H_5$, and acac represents acetylacetonato.

FIG. 7 is an ALD or CVD process cycle 700 for forming a noble metal layer in accordance with an implementation of the invention. The noble metal layer that is formed may have a thickness that is less than or equal to 20 Å and a density that is greater than or equal to 5 grams per cubic centimeter (g/cm$^3$) and preferably greater than 19 g/cm$^3$. The process cycle is carried out on a semiconductor substrate that is within a reaction chamber. The process cycle 700 begins by pulsing an organometallic precursor that contains the desired noble metal into the reaction chamber proximate to the semiconductor wafer (702). The reaction chamber may be at a pressure that ranges from around 0.05 Torr to around 2 Torr, with a pressure of around 0.25 Torr being used often. The precursor may have a temperature that ranges from around 80° C. to around 300° C. In most implementations, the ALD or CVD deposition may be carried out at a precursor temperature around or less than 200° C. The semiconductor substrate may be heated to a temperature that may range from around 150° C. to around 600° C., with a substrate temperature between 220° C. and 350° C. being most common.

In some implementations, the organometallic precursor may be pulsed into a reaction chamber at a flow rate that ranges up to 5 standard liters per minute (SLM) for a time duration that ranges from 0.1 seconds to 5 seconds. A carrier gas such as nitrogen, argon, or helium may be used to transport the organometallic precursor into the reaction chamber. Accordingly, it may be the carrier gas that has the flow rate that ranges up to 5 SLM. Other implementations may use different flow rates and time durations.

The process cycle 700 continues by purging the reaction chamber with an inert gas such as helium (He), argon (Ar), N$_2$, or forming gas (704). The purge may last for a time duration that ranges from 0.1 seconds to 10 seconds. Next, a reactive gas is pulsed into the reaction chamber proximate to the semiconductor wafer (706). Reactive gases that may be used in the process cycle 700 include, but are not limited to, hydrogen (H$_2$), silane, B$_2$H$_6$, oxygen (O$_2$), NH$_3$, forming gas (e.g., 5% H$_2$ in N$_2$), and mixtures thereof. The reactive gas pulse may last for a time duration that ranges from 0.1 seconds to 5 seconds, with a time period of around 0.5 seconds being used in some implementations. The reactive gas reacts with the organometallic precursor to form a noble metal layer directly on a dielectric layer of the semiconductor substrate. In some implementations, the flow rate for the reactive gas pulse may range up to 0.1 standard cubic centimeters per minute (SCCM).

A final purge may take place for a time duration of around 0.1 seconds to 10 seconds (708). At this point one cycle has been completed and the process cycle 700 may be repeated until the desired film properties and thickness are generated.

FIG. 8 is an implementation of another process cycle 800 in accordance with the invention where a CVD type deposition process may be implemented. The process cycle 800 begins by pulsing an organometallic precursor that contains the desired noble metal into the reaction chamber proximate to a semiconductor substrate (802). As described above, the reaction chamber may be at a pressure that ranges from around 0.05 Torr to around 2 Torr, the precursor may have a temperature that ranges from around 80° C. to around 300° C., and the substrate temperature may range from around 150° C. to around 600° C. Nitrogen, argon, or helium may be used as the carrier gas with a flow rate up to 5 SLM. The organometallic precursor pulse may range from 0.1 seconds to 5 seconds. Other implementations may use different flow rates and time durations.

A partial purging process is then carried out to allow some or all of the organometallic precursor to remain in the reaction chamber (804). The partial purge may last for a time duration that ranges from 0.1 seconds to 10 seconds. In some implementations, the partial purge may be completely omitted. Next, the process cycle 800 pulses the reactive gas into the reaction chamber proximate to the substrate (806). The reactive gas pulse may last for a time duration that ranges from 0.1 seconds to 5 seconds. The process cycle 800 therefore enables the organometallic precursor to react with the reactive gas prior to deposition on the substrate. Again, the end result is a noble metal layer that is formed directly upon a dielectric layer of the substrate.

Next, the reaction chamber may be completely purged (808). The process cycle 800 may be repeated as necessary to produce a noble metal layer with the desired properties. In an alternate implementation of the process cycle 800, the organometallic precursor and the reactive gas may be pulsed into the reaction chamber at substantially the same time.

In another implementation of the invention, one or more alloy gases may be co-deposited with the organometallic precursor, resulting in an alloyed noble metal layer being formed. The alloy gases tend to prefer co-depositing with the noble metal over reacting with the organometallic precursor. The alloy gas used to form the alloyed noble metal layer may include, but is not limited to, primary silanes, secondary silanes, tertiary silanes, quaternary silanes, primary alkyl amines, secondary alkyl amines, tertiary alkyl amines, methane, BH$_3$, B$_2$H$_6$, primary alkyl alanes, secondary alkyl alanes, tertiary alkyl alanes, phosphine, germanes, dihalides, and hydrohalide acids. The alloy gas may function to saturate grain boundaries and densify the deposited noble metal layer.

FIG. 9 is an implementation of a process cycle 900 in accordance with the invention where an alloyed noble metal layer may be formed. The process cycle 900 begins by pulsing an organometallic precursor that contains the desired noble metal into a reaction chamber proximate to a semiconductor substrate (902). As described above, the reaction chamber may be at a pressure that ranges from around 0.05 Torr to around 2 Torr, the precursor may have a temperature that ranges from around 80° C. to around 300° C., and the substrate temperature may range from around 150° C. to around 600° C. Nitrogen, argon, or helium may be used as the carrier gas with a flow rate up to 5 SLM. The organometallic precursor pulse may range from 0.1 seconds to 5 seconds. Other implementations may use different flow rates and time durations.

The process cycle 900 may then purge the reaction chamber with an inert gas, such as He, N$_2$, or forming gas (904). The purge may last for a time duration that ranges from 0.1 seconds to 10 seconds. Next, the process cycle 900 pulses the alloy gas into the reaction chamber (906). As described above, the alloy gas generally co-deposits with the noble metal and may also saturate grain boundaries and densify the deposited noble metal layer. The reaction chamber may then be purged again (908), and the process cycle 900 may be repeated as necessary to produce a noble metal layer with the desired properties. Furthermore, after the alloyed noble metal layer has been formed, the alloyed noble metal layer may be treated or annealed to saturate the grain boundaries with light elements that include, but are not limited to, carbon, nitrogen, oxygen, and boron (910). In alternate implementations of the process cycle 900, the organometallic precursor and the alloy gas may be pulsed into the reaction chamber at substantially the same time.

In yet another implementation of the invention, a plasma enhanced process may be used to deposit an amorphous noble metal layer. One advantage of using an amorphous noble metal layer in lieu of a crystalline noble metal layer is that the barrier layer properties of the noble metal layer are enhanced. In particular, the copper metal that is deposited atop the noble metal layer is disfavored from diffusing along the crystalline grain boundaries.

FIG. 10 illustrates an implementation of a process cycle 1000 for producing an amorphous noble metal layer in accordance with the invention. The process cycle 1000 pulses an organometallic precursor into the reaction chamber for adsorption onto a substrate surface, for example, a dielectric layer on a semiconductor substrate (1002). The organometallic precursor may be in plasma form when it is pulsed into the chamber. As described above, the reaction chamber may be at a pressure that ranges from around 0.05 Torr to around 2 Torr, the precursor may have a temperature that ranges from around 80° C. to around 350° C., and the substrate temperature may range from around 150° C. to around 600° C. Nitrogen, argon, or helium may be used as the carrier gas with a flow rate up to 5 SLM. The organometallic precursor pulse may range from 0.1 seconds to 5 seconds in the presence or absence of plasma. The plasma may be struck in the presence of hydrogen, nitrogen, argon, helium, or mixtures thereof. Other implementations may use different flow rates and time durations.

The reaction chamber may then be purged, for instance, with an inert gas such as He, $N_2$, neon (Ne), argon (Ar), krypton (Kr), or forming gas (1004). The purge may last for a time duration that ranges from 0.1 seconds to 10 seconds.

The process cycle 1000 may then pulse a co-reactant species and a plasma species, referred to herein as a disrupting plasma species, into the reaction chamber for adsorption onto the substrate surface (1006). The co-reactant species may consist of a reactive gas and/or an alloy gas as described above. The disrupting plasma species may include, but is not limited to, phosphorous (P), nitrogen (N), carbon (C), or boron (B). The disrupting plasma introduces an energetic species that tends to disrupt the formation of long range order (e.g., crystalline order) in the deposited noble metal layer. Process parameters including but not limited to plasma pulse duration, plasma power modulation, entering plasma gases, deposition rate (via precursor or co-reactant flow rate), pressure, temperature, and other parameters may be used to effect the resultant noble metal layer and/or disrupt its long range order. In some implementations, a capacitively-coupled RF (e.g., 13.56 MHz) plasma source may be used.

The reaction chamber may then be purged again (1008) and the process cycle 1000 may introduce another pulse of the organometallic precursor into the reaction chamber for adsorption onto the substrate surface (1010). This may be followed by another purge of the reaction chamber (1012). In accordance with implementations of the invention, this process 1000 may be repeated as necessary to build up the amorphous noble metal layer to a desired thickness of between 3 Å and 75 Å.

In implementations of the invention, the use of a plasma disrupting species enables the deposition of noble metal layers at relatively low temperatures. For instance, temperatures below 150° C. may be used during the deposition of the amorphous noble metal layer. Furthermore, the use of lower temperatures further contributes to disrupting any long range order in the noble metal layer.

As may be known to those of skill in the art, the use of a plasma disrupting species may tend to form an amorphous noble metal layer that is metastable. To reduce or eliminate the potential for instability, light elements such as P, N, C or B may be used as these elements tend to disrupt the lattice permanently. In implementations of the invention, to avoid the formation of an alloyed metal layer, the light element may be pulsed at sufficiently low concentrations that allow for interstitial solubility, rather than being pulsed in a continuous manner.

In another implementation, light elements as described above (e.g., P, N, C or B) may be deposited such that the light element forms one or more layers that are within or that encase one or more pure noble metal layers to preserve the amorphous quality. For instance, the light elements layer may be formed at the center of the noble metal layer or at one or more interfaces of the noble metal layer. The metal layer may therefore be composed of several layers with varying levels of the light element that function to substantially prevent further processing from recrystallizing the noble metal layer.

In another implementation of the invention, a reactive aluminum precursor may be used to facilitate deposition of the noble metal onto substrate surfaces to which the noble metal would not ordinarily adhere. The reactive aluminum precursor may include, but is not limited to, methylpyrrolidine alane (MPA), triisobutylaluminum, aluminum s-butoxide, trimethylaluminum ($AlMe_3$ or TMA), triethylaluminum ($AlEt_3$ or TEA), di-i-butylaluminum chloride, di-i-butylaluminum hydride, diethylaluminum chloride, tri-i-butylaluminum, and triethyl(tri-sec-butoxy)dialuminum.

FIG. 11 describes an implementation of a process cycle 1100 for forming a noble metal layer using an aluminum precursor in accordance with the invention. The process cycle 1100 begins by introducing one or more pulses of a reactive aluminum precursor into the reaction chamber (1102). In one implementation of the invention, for instance, around 20 pulses of TMA may be used with each pulse having a time duration of around 1 second. In implementations, the temperature of the reactive aluminum precursor may range from around 150° C. to around 300° C.

This is followed by the process cycle 1100 pulsing the organometallic precursor into the reaction chamber to cause substrate saturation (1104). Again, the reaction chamber may be at a pressure that ranges from around 0.05 Torr to around 2 Torr, the precursor may have a temperature that ranges from around 80° C. to around 300° C., and the substrate temperature may range from around 150° C. to around 600° C. Nitrogen may again be used as the carrier gas with a flow rate up to 5 SLM. The organometallic precursor pulse may range from 0.1 seconds to 5 seconds. Other implementations may use different flow rates and time durations.

The cycle 1100 may continue with a purge of the reaction chamber (1106), followed by pulsing a co-reactant into the reaction chamber to saturate the surface (1108). The co-reactant may include one or more materials such as the reactive gases or the alloy gases described above. The reaction chamber may be purged again to end the process cycle (1110). This process cycle 1100 may then be repeated as often as needed until the desired film properties and thickness for the noble metal layer are generated. When the process cycle 1100 is repeated, in some implementations the pulsing of the reactive aluminum precursor may be repeated while in other implementations the pulsing of the reactive aluminum precursor may be omitted.

In accordance with another implementation of the invention, the noble metal layer may be formed such that its density varies along the deposition area. In some implementations, this may be accomplished by treating the metal layer with a directed plasma with the option of using a biased substrate. The bias conditions may range from 10V to 100V, with a typical bias being around 60V. For example, during a process to form the noble metal layer, after an organometallic precursor pulse and a co-reactant species pulse, a directional plasma burst may be used to lower the density of the film at locations such as the field or a via. This may be used to preferentially etch these areas for conductivity, polishing, or patterning improvements.

In further implementations, the opposite effect may be effected to create a denser film at locations such as the field or a via. The may result in the deposition of a non-conformal noble metal layer due to the increased deposition rates at certain locations. The process of increased densification of certain locations allows a thinner noble metal layer to be used, for instance, a thinner noble metal layer may be used in a via to enable higher via conductivity and shorter polishing times.

Densification of the noble metal layer may be accomplished in different ways depending on the deposition conditions. For noble metal layers deposited using a PVD process, the layer density is usually near bulk, but may be changed by treating the noble metal layer with ions of an inert gas (e.g., Ar, Xe, or $N_2$) at energies just below those used for sputtering conditions. In some implementations, ion beam energies between 25 eV and 100 eV may be produced using beam currents that are between 20V per beam to 75V per beam. For noble metal layers deposited using an ALD process, an increase in power density from 0.001 W/cm² to 10 W/cm² can increase the density of the noble metal layer. In addition, the use of a nitrogen plasma can also result in a more dense noble metal layer.

In further implementations of the invention, after the noble metal layer is formed, any oxides, water, or other impurities that may adversely effect the subsequent copper metallization process may be removed. In one implementation, the oxides may be removed by exposing the noble metal layer to a reducing atmosphere of hydrogen gas and nitrogen gas.

As described above, the noble metal layer of the invention provides a single layer that functions as a copper barrier and a seed layer, thereby enabling copper gapfill in backend applications while using less process steps and less tooling than conventional methods that employ a TaN/Ta stack. The noble metal layers are relatively thin and are capable of conformally depositing on aggressive geometries, using novel organometallic precursors for ALD and CVD processes.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
a substrate;
a dielectric layer over the substrate;
an interconnect structure within the dielectric layer;
a bulk metal of the interconnect structure; and
an amorphous noble metal barrier layer of the interconnect structure disposed between the bulk metal and the dielectric layer, the amorphous noble metal barrier layer including an alloy including mainly one or more noble metals selected from iridium, platinum, palladium, rhodium, osmium, gold, silver, rhenium, and nickel, together with one or more elements selected from carbon and boron, wherein the one or more elements selected from carbon and boron are at a sufficiently low level for interstitial solubility without alloying with the amorphous noble metal barrier layer, wherein the noble metal barrier layer has a thickness that is less than 50 Angstroms, and wherein a density of the noble metal barrier layer is greater than 16 g/cm³.

2. The apparatus of claim 1, wherein the barrier layer is directly on the dielectric layer and the bulk metal is directly on the barrier layer.

3. The apparatus of claim 1, wherein the barrier layer has a thickness that is substantially conformal.

4. The apparatus of claim 1, wherein the barrier layer has a density that is greater than 19 g/cm³.

5. The apparatus of claim 1, wherein the bulk metal comprises copper.

6. The apparatus of claim 1, wherein the barrier layer including one or more metals selected from iridium, osmium, rhenium, platinum, and palladium.

7. The apparatus of claim 6, wherein the barrier material comprises one or more selected from iridium, osmium, and rhenium.

8. The apparatus of claim 7, wherein the barrier material comprises iridium.

9. The apparatus of claim 1, wherein the interconnect structure comprises a via.

10. The apparatus of claim 9, wherein the via contacts a gate electrode of a transistor.

11. The apparatus of claim 10, wherein the bulk metal comprises copper, wherein the barrier layer is substantially conformal.

12. The apparatus of claim 11, wherein the barrier layer includes one or more metals selected from iridium, osmium, rhenium, platinum, and palladium, and wherein the barrier layer is disposed immediately between the dielectric layer and the bulk metal.

13. The apparatus of claim 1, wherein the one or more elements selected from the carbon, the nitrogen, and the boron are at a level sufficient to substantially saturate grain boundaries in the barrier layer.

14. The apparatus of claim 1, wherein the one or more elements selected from the carbon, the nitrogen, and the boron are at a sufficiently low level for interstitial solubility to avoid the formation of an alloyed metal layer.

15. The apparatus of claim 1, wherein the barrier layer has multiple layers with different levels of the one or more elements selected from the carbon, the nitrogen, and the boron.

16. The apparatus of claim 1, wherein the barrier layer includes the alloy including the one or more noble metals selected from iridium, osmium, platinum, palladium, rhodium, gold, silver, rhenium, and nickel, together with one or more elements selected from carbon and boron.

17. An apparatus comprising:
a gate electrode of a transistor;
a dielectric material over the gate electrode; and
a via in the dielectric material and in contact with the gate electrode, the via including a plug and an amorphous noble metal barrier material, the amorphous barrier material disposed between the plug and the dielectric material, the amorphous noble metal barrier material including primarily an alloy including one or more noble metals selected from iridium, platinum, palladium, rhodium, osmium, gold, silver, rhenium, ruthenium, and nickel together with one or more elements selected from carbon and boron at a low level for interstitial solubility, the plug including one or more metals selected from copper and aluminum, wherein the noble metal barrier layer has a thickness that is less than 50 Angstroms, and wherein a density of the noble metal barrier layer is greater than 16 g/cm$^3$.

18. The apparatus of claim 17, wherein the barrier material includes one or more metals selected from iridium, osmium, rhenium, platinum, and palladium.

19. The apparatus of claim 17, wherein the barrier material has a thickness that is substantially conformal.

20. An apparatus comprising:
a substrate;
a dielectric layer over the substrate;
an interconnect structure within the dielectric layer;
a bulk metal of the interconnect structure; and
an amorphous noble metal barrier layer of the interconnect structure disposed between the bulk metal and the dielectric layer, the amorphous noble metal barrier layer including mostly one or more noble metals selected from iridium, platinum, palladium, rhodium, osmium, gold, silver, rhenium, ruthenium, and nickel, the amorphous noble metal barrier layer also including at least one disrupting species to disrupt long range order in the noble metal barrier layer, wherein the at least one disrupting species is at a sufficiently low level for interstitial solubility without alloying with the amorphous noble metal barrier layer, wherein the amorphous noble metal barrier layer has a thickness that is less than 50 Angstroms, and wherein a density of the noble metal barrier layer is greater than 16 g/cm$^3$.

21. The apparatus of claim 20, wherein the barrier layer is directly on the dielectric layer and the bulk metal is directly on the barrier layer, and wherein the bulk metal comprises copper.

22. The apparatus of claim 20, wherein the barrier material comprises one or more selected from iridium, osmium, and rhenium.

23. The apparatus of claim 20, wherein the at least one disrupting species comprises at least one species selected from phosphorous, nitrogen, carbon, and boron.

24. The apparatus of claim 20, wherein the at least one disrupting species is sufficient to disrupt long range order in the barrier layer.

25. The apparatus of claim 20, wherein the barrier layer has several layers with varying levels of the disrupting species.

* * * * *